US009531353B2

(12) United States Patent
Iskander et al.

(10) Patent No.: US 9,531,353 B2
(45) Date of Patent: Dec. 27, 2016

(54) SWITCHING ARRANGEMENT (75) Inventors: Stephen Mark Iskander, Chelmsford (GB); Michael John Bland, Welwyn (GB); Paul Ridgwell, Chelmsford (GB)

(73) Assignee: E2V TECHNOLOGIES (UK) LIMITED, Chelmsford (GB)

( * ) Notice: Subject to any disclaimer, the term of this patent is extended or adjusted under 35 U.S.C. 154(b) by 545 days.

(21) Appl. No.: 13/807,543

(22) PCT Filed: Jun. 29, 2011

(86) PCT No.: PCT/GB2011/051227
§ 371 (c)(1),
(2), (4) Date: May 15, 2013

(87) PCT Pub. No.: WO2012/001409
PCT Pub. Date: Jan. 5, 2012

(65) Prior Publication Data
US 2013/0221876 A1 Aug. 29, 2013

(30) Foreign Application Priority Data
Jun. 30, 2010 (GB) .................................. 1010919.7

(51) Int. Cl.
H05H 9/00 (2006.01)
H03K 3/53 (2006.01)

(52) U.S. Cl.
CPC . *H03K 3/53* (2013.01); *H05H 9/00* (2013.01)

(58) Field of Classification Search
None
See application file for complete search history.

(56) References Cited

U.S. PATENT DOCUMENTS

| 3,496,378 | A |   | 2/1970  | Sakamoto                |
|-----------|---|---|---------|-------------------------|
| 4,713,581 | A | * | 12/1987 | Haimson ........... 315/5.41 |
| 5,568,035 | A |   | 10/1996 | Kato et al.             |
| 5,933,335 | A | * | 8/1999  | Hitchcock et al. ..... 363/25 |
| 6,241,751 | B1|   | 6/2001  | Morgan et al.           |

(Continued)

FOREIGN PATENT DOCUMENTS

| CN | 101355301 A | 1/2009 |
| EP | 0590318 A1  | 4/1994 |

(Continued)

OTHER PUBLICATIONS

International Search Report of PCT/GB2011/051227 Dated Nov. 2, 2011.

(Continued)

*Primary Examiner* — Cassandra Cox
(74) *Attorney, Agent, or Firm* — FisherBroyles, LLP; Robert Kinberg (57) ABSTRACT

A switching arrangement for applying voltage pulses across a load, comprising a plurality of capacitive elements (C1-C9) connected in series, and a first switch arrangement (S) connected to the series connection to apply voltage pulses to the load, and a second switch arrangement (S1, S2) connected to a capacitive element of the series connection, such that one of the capacitive elements (C1) can be switched out of or switched into the series connection, in order to produce voltage pulses of respectively lower or higher levels, without the need to dissipate energy into a resistive load.

20 Claims, 7 Drawing Sheets

(56) References Cited

U.S. PATENT DOCUMENTS

| | | |
|---|---|---|
| 6,396,332 B2 | 5/2002 | Richardson |
| 7,257,188 B2 | 8/2007 | Bjorkholm |
| 2005/0088376 A1* | 4/2005 | Inoue et al. .................... 345/60 |
| 2005/0248216 A1 | 11/2005 | Cassel |
| 2007/0139090 A1* | 6/2007 | Cassel .......................... 327/181 |
| 2009/0316438 A1 | 12/2009 | Crewson et al. |
| 2010/0038563 A1 | 2/2010 | Chen et al. |

FOREIGN PATENT DOCUMENTS

| | | |
|---|---|---|
| JP | 2003059678 | 2/2003 |
| WO | WO-2008109830 A1 | 9/2008 |

OTHER PUBLICATIONS

Office Action issued in Chinese Patent Application No. 201180040411.8 dated Feb. 28, 2015.

* cited by examiner

SWITCHING ARRANGEMENT

This invention relates to switching arrangements, especially for applying high voltage pulses across a load.

Figure 1:
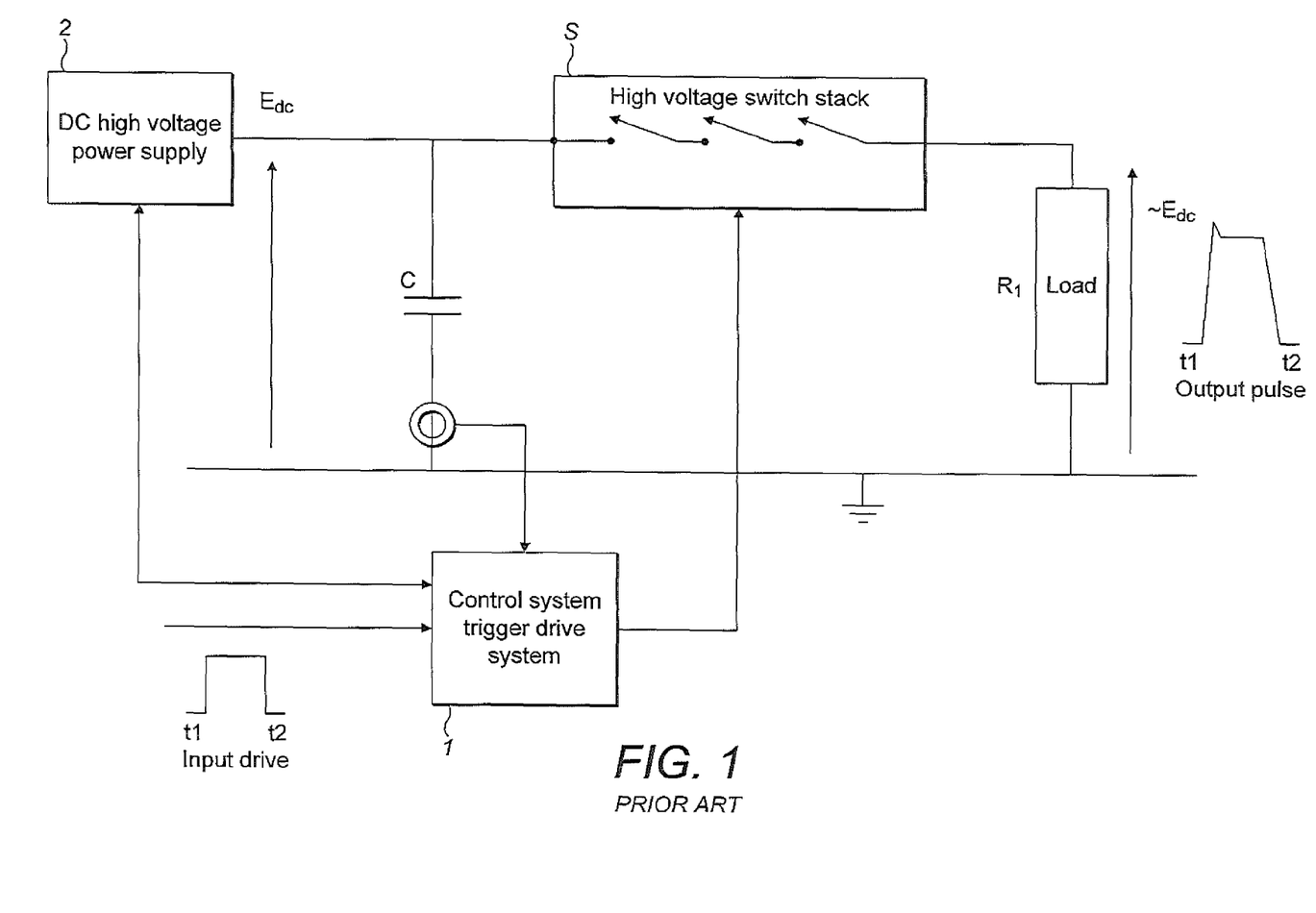
FIG. 1 is a schematic circuit diagram of a known switching arrangement.

Referring to FIG. 1, which is a schematic circuit diagram of a known switching arrangement, the switching arrangement comprises a storage capacitor C and a switch arrangement S (U.S. Pat. No. 6,396,332). The switch S is controlled by a trigger drive system 1 to apply high voltage pulses across a load $R_1$, such as a magnetron, and the storage capacitor may be replenished from a DC power supply 2. The combination of the switching arrangement and the DC power supply is often referred to as a modulator. Input pulses ($t_1$ to $t_2$) to trigger drive system cause high voltage pulses to be applied to the load resistor, the applied voltage pulse being shown by waveform $E_{dc}$. The storage capacitor may be made up of a stack of capacitive elements in series connection, and each capacitive element may be made up of a number of capacitors in parallel. The capacitive elements are charged in series, as well as being discharged in series, in contrast to known Marx-type generators in which a stack of capacitive elements is discharged in series but charged in parallel (WO 2008/109830, U.S. Pat. No. 3,496,378, JP 2003059678 and EP 0 590 318). The switch S may be made up of a number of modules connected in series in order to switch a high voltage pulse using modules individually of much lower voltage rating.

Figure 2:
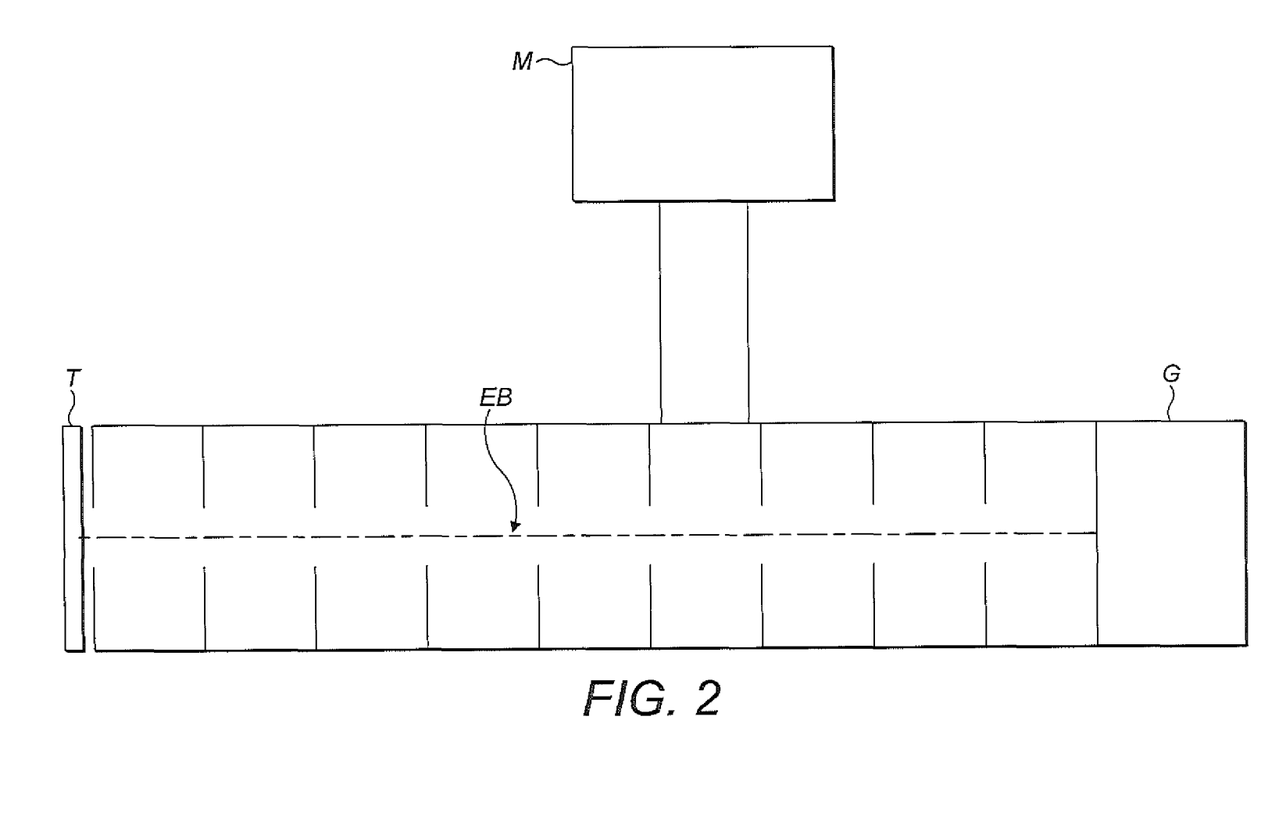
FIG. 2 is a schematic diagram of a linac driven by a magnetron.

One application of this is in linear accelerators (linacs). FIG. 2 is a schematic view of a linac accelerator structure. An electron beam EB created by an electron gun G is formed into pulses by means of resonant cavities and accelerated by injected r.f. energy from an r.f. source such as a magnetron M before it strikes a target T to generate X-rays. X-rays at different energy levels can be readily produced by changing the r.f. energy injected into the linac, and/or the electron beam current. The linacs can be used for therapeutic and industrial treatments.

X-ray scanners are also used for cargo inspection purposes. To obtain enhanced information about the cargo, and particularly to obtain a unique signature for high density materials, dual energy scanning (U.S. Pat. No. 7,257,188) and interlaced multi-energy scanning (U.S. Patent Publication No. 20100038563) may be employed.

There are occasions when it would be desirable for the linac to be able to vary the energy of the X-ray pulses generated on a very rapid basis, for example, on a pulse-by-pulse basis. However, with the switching arrangement described above, it is only possible to produce different energy levels by dissipating a fraction of the energy stored in the capacitors in a resistive load, which would cause thermal problems and a loss of efficiency.

The invention provides a switching arrangement for applying voltage pulses across a load, comprising a plurality of capacitive elements connected in series, a first switch arrangement for connecting one end of the series connection to one end of the load, and a second switch arrangement selectively for connecting the other end of the series connection or a tapping between the ends of the series connection, to the other end of the load, in order to enable higher or lower voltage pulse levels to be applied across the load.

With such a switching arrangement, different voltage levels can be produced without any significant loss of energy.

The second switch arrangement may comprise a pair of switches, which are controllable to be open and closed in opposition to each other, respectively connected in series in the path from the tapping to the said other end of the series connection, and in parallel with that path. Diodes may be connected in anti-parallel with the switches. The switches may be solid state or vacuum tubes.

One way of carrying out the invention will now be described in detail, by way of example, with reference to the accompanying drawings, in which.

Like parts have been given like reference numerals throughout all the drawings.

Figure 3:
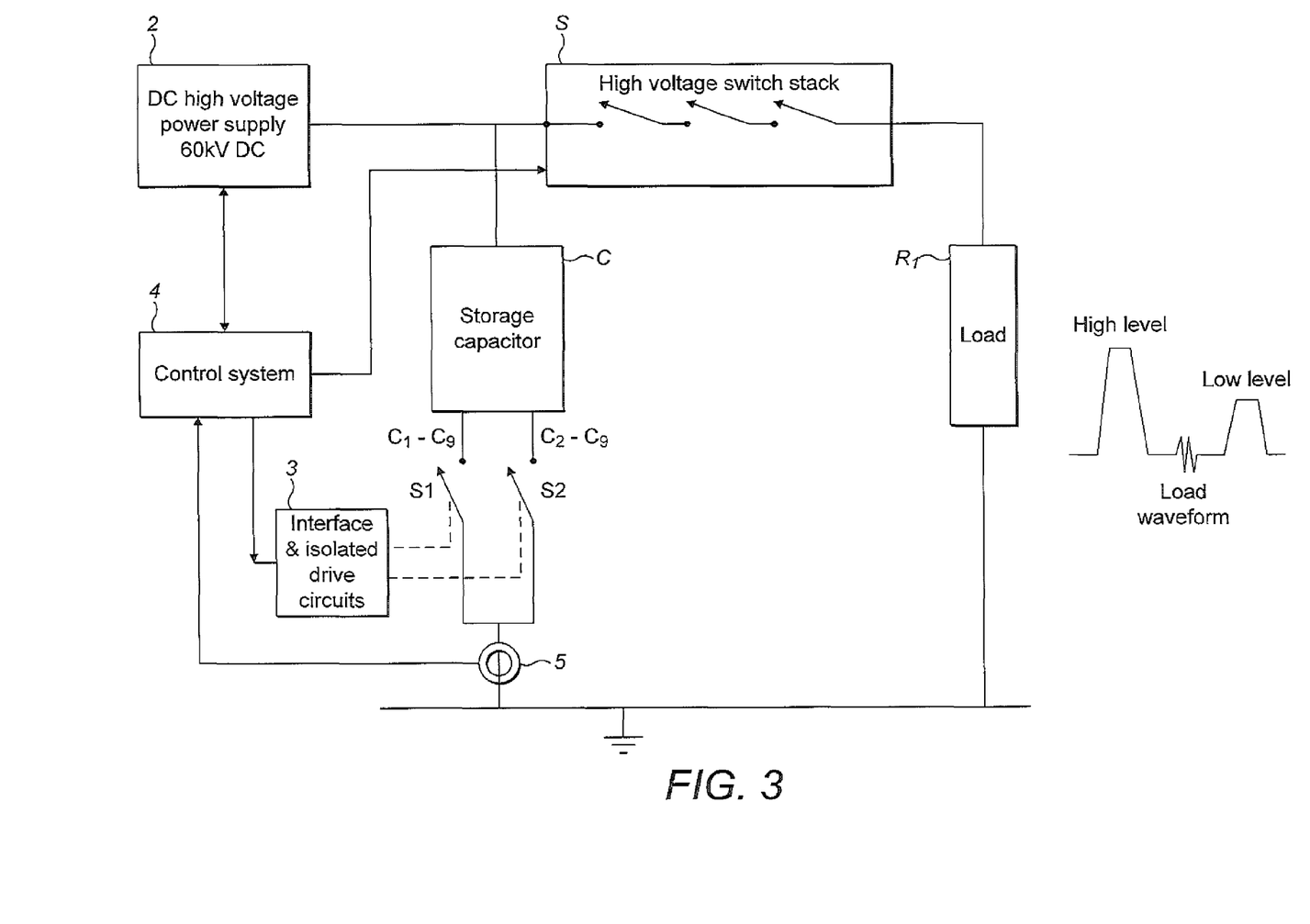
FIG. 3 is a schematic circuit diagram of the switching arrangement of the invention.

Referring to FIG. 3, the switching arrangement of the invention includes a first switch arrangement in the form of a high voltage switch stack S of solid state switches connected in series for connecting a storage capacitor C to a load $R_1$ (a magnetron) under the control of a trigger drive system (not shown). The storage capacitor C consists of a stack of capacitive elements C1-C9 arranged in series (shown in FIG. 4). The storage capacitor is charged from a high voltage power supply 2.

In accordance with the invention, a second switch arrangement S1, S2 is provided to enable a capacitive element C1 to be switched out of and into the stack of capacitive elements C1-C9 (not shown). Switch arrangement S1, S2 connects the low voltage end of the load either to the entire series connection C1-C9, or to the series connection C2-C9. When high voltage switch stack S is closed, either of two HT voltage levels (C1-C9, or C2-C9) are switched across the load $R_1$, depending on which of operating switches S1 and S2 is closed. Thus, two different voltage levels can be selectively applied to the load (the load voltage pulses are shown schematically).

Control system 4 controls an isolated drive circuit 3 to operate the switches S1, S2 to switch the capacitive element C1 into and out of the stack. The control terminals of S1 and S2 are isolated from ground, since through a full cycle of S1 and S2 switching, they will swing in potential by +/− the voltage on C1. The current through the load is monitored by current sensor 5.

Figure 4:
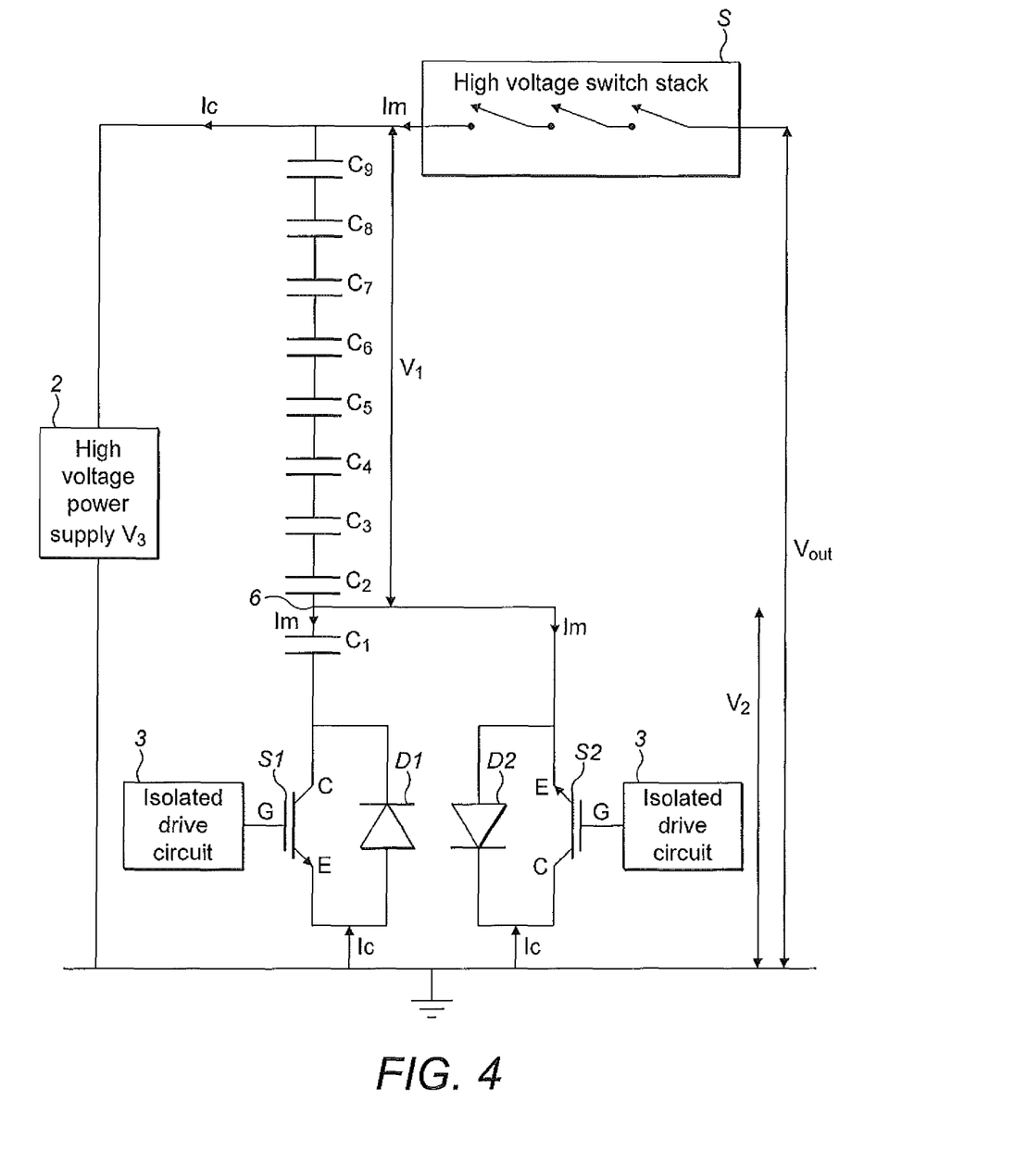
FIG. 4 is a schematic circuit diagram of parts of a first embodiment of the switching arrangement of FIG. 3.
Figure 5:
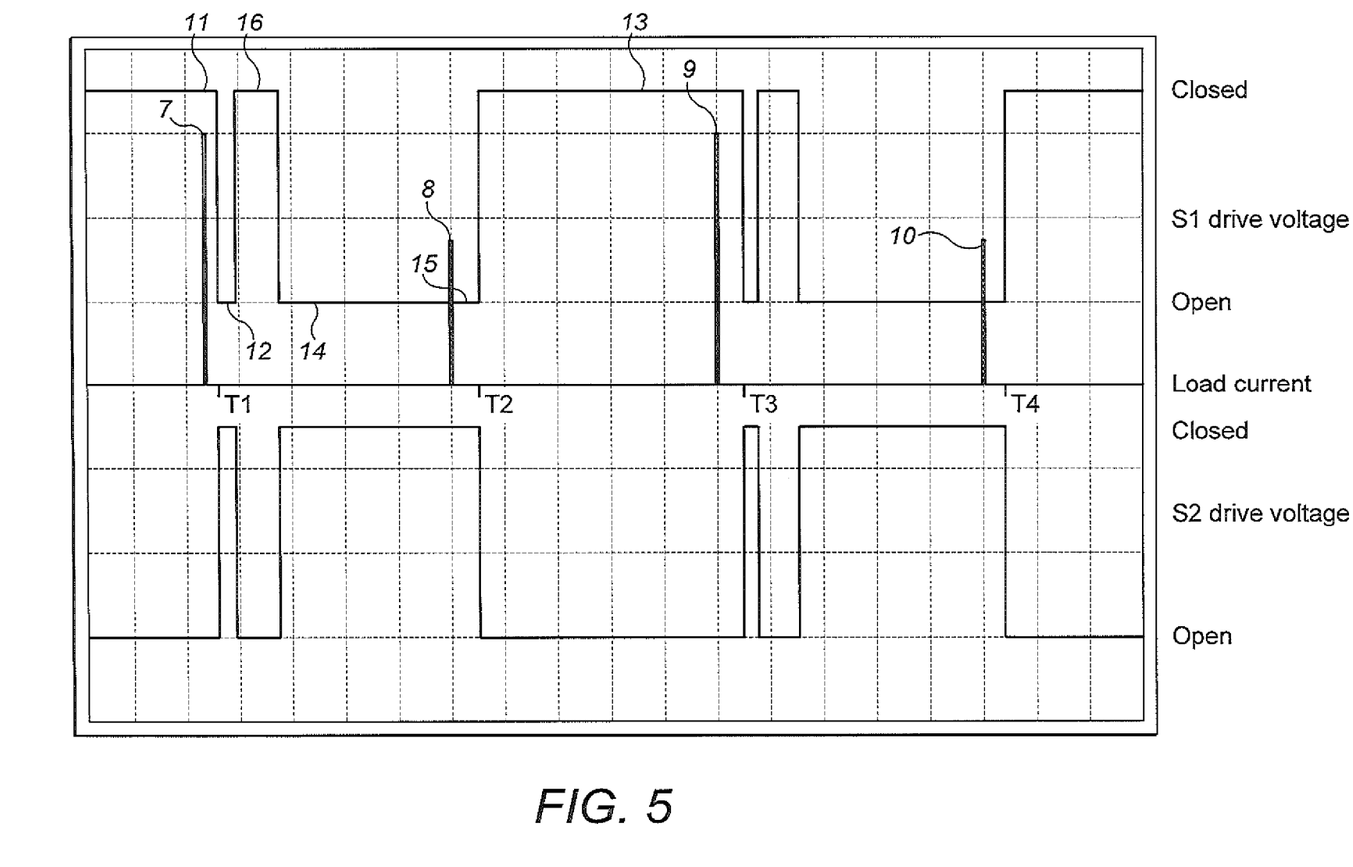
FIG. 5 is a timing diagram showing the drive pulses applied to the second switch arrangement of the embodiment shown in FIG. 4, and the load current.

Referring to FIGS. 4 and 5, in a first embodiment of the invention, the capacitive element C1 is switched in and out of the series connection in the following way. The low voltage (earth) end of the load is connected to the low voltage end of the entire series connection C1-C9 when switch S1 (in series with C1) is closed, and to tapping 6 at the junction of capacitive elements C1, C2 when switch S1 is open, since switch S2 (in parallel with C1) is now closed. The operation of switches S1 and S2 is complementary, that is, when switch S1 is open, switch S2 is closed, and vice versa.

The upper waveform in FIG. 5 shows the gate voltage applied to transistor S1, and the lower waveform shows the gate voltage applied to transistor S2. The top of each waveform indicates the periods when the respective transistors are conductive and the switch therefore closed, and the bottom of each waveform indicates the periods when they are non-conductive and the switch is therefore open. The central waveform shows the load current, the high level pulses being 7 and 9, and the low level pulses being 8 and 10. These pulses are generated when switch S is closed.

It will be seen from FIG. 5 that switch S1 opens at time T1 just after high level pulse 7 and stays open for most of the time before low level pulse 8. Just after low level pulse 8, at time T2, switch S1 closes and stays closed until a little after the next high level pulse 9 at time T3. Switch S1 remains open for the majority of the time before the next low level pulse 10 and closes shortly after at time T4. This pattern is repeated.

When the voltage pulses are delivered, a large load current (typically, for a magnetron, of the order of 100 amps), Im flows to the load through the series connection C9-C2, and either through the switchable capacitive element C1, or through the parallel connection from the tapping 6. In the periods between the pulses, the charge in the capacitive elements is replenished by the high voltage power supply 2, and charging current Ic flows into the capacitive stack C2 to C9 through the parallel connection via switch S2, or charging current flows through the entire stack C1 to C9, through the series connection through switch S1.

In order to replenish the capacitive elements by the desired amount, algorithms of the control system 4 are responsible for measuring the voltage across the respective stacks C1-C9, C2-C9 after each magnetron pulse to ascertain how much they have been drained, measuring the current drawn by the magnetron during the pulse, and taking account of any input command for a specified amount of current or rf energy or specified energy difference between the pulses. The latter could depend on the requirements of the cargo being scanned. Certain specific values of rf energy may be demanded, which would imply certain specified magnetron peak currents, and, in turn, certain negative cathode voltage levels. The high and low voltage levels would be made to correspond to these levels by an appropriate amount of recharging.

The voltages remaining on the stack after the pulses have been delivered are measured as follows. Just after the high level pulses, the control system 4 measures the voltage remaining across the entire stack C1 to C9 (during period 11), and immediately following the opening of S1 (period 12), the voltage remaining across the stack C2 to C9, from which the voltage remaining across C1 can be inferred.

This enables the magnitude and duration of recharge current (typically, hundreds of milliamps) to be determined, so that the stack C1 to C9, and C2 to C9, can be appropriately recharged. Stack C1 to C9 is recharged within period 13 and stack C2 to C9 within period 14.

A disadvantage with such a simple charging pattern is that the ratio between the high and low level pulses could be fixed, for example, in the ratio 8 to 9. In order to avoid this, in the short period 15 after the low level pulse while the switch S1 is open, the stack C2 to C9 can be charged in advance of the main recharge of the entire stack after S1 has closed. Equally, in advance of the recharge of the stack C2 to C9 before the low level pulse, switch S1 closes briefly at period 16 to enable a brief charge to be applied to the entire stack C1 to C9. In the former situation, C1 would receive less charge than the fixed ratio, and in the latter case, more than the fixed ratio. Thus, it is within the scope of the invention for the voltages on capacitor C1, and on the stack of capacitors C2 to C9, to be controlled independently.

While FIG. 5 shows the switch arrangement as producing alternate low and high level pulses, the invention is also applicable to other patterns of pulses, for example, one low level pulse between pairs of high level pulses, or any other pulse pattern.

The switches S1, S2 are implemented by insulated gate bipolar transistors (IGBTs), with diodes D1, D2 connected in parallel with the respective switches. The operation is as follows.

To allow recharging of capacitive elements C2-C9 alone, S1 is open, and S2 closed. Recharge current Ic will flow in the conventional direction in S2, whilst D2 will be reverse biased. Although diode D1 could allow recharge current to flow in C1, tapping 6 is effectively grounded by S2, which therefore excludes C1 from the recharging process. In any case, any history that resulted in C1 charging at all would have resulted in its S1 end being left more positive than its S2 end. This would result in D1 being reverse biased, again effectively blocking C1 to recharge current.

To allow recharging of the entire series connection C1-C9, S1 is closed and S2 open. Recharge current will flow in D1. D1 will clamp this end of C1 to ground, and because the recharge current will cause the voltage at tapping 6 to increase negatively, D2 will remain reverse-biased, allowing the process to continue. Note that S1 does not need to be switched on for recharging purposes (only for load pulse purposes), because D1 is providing the conduction path, as described.

A modified switching pattern is possible, whereby S1 opens during the period when a high voltage pulse is being delivered (switch S therefore being closed). The load current then flows in D2 to complete the path so that the remainder of the load pulse is low level, allowing the amplitude of the pulse to change during the pulse.

For the shorter recharging periods 15, 16, the power supply 2 may be set to a voltage considerably in excess of the desired voltage. For the longer recharging periods 13, 14, the power supply 2 is controlled to end the charging period at just the desired voltage the stack is to be reset to, although it may if desired start the replenishment at a higher voltage.

Figure 6:
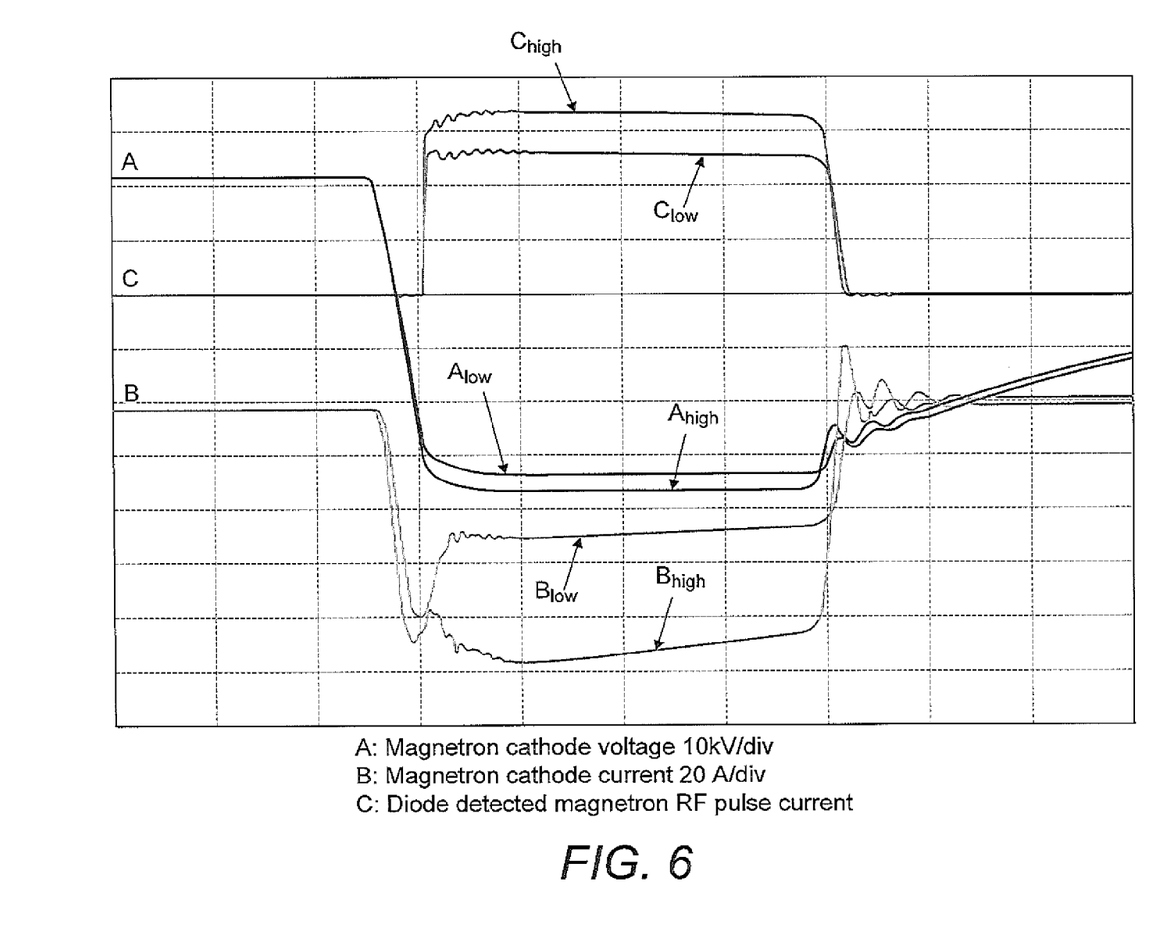
FIG. 6 shows the different r.f. energy levels produced by a magnetron forming a load of the embodiment of FIG. 4 in response to the two pulse voltage levels.

A typical value for the high voltage power supply is −60 kV. This can be split between nine capacitive elements, each rated at around 7 kV. This would enable the magnetron to be driven with voltage pulses of −60 kV and −53 kV. Each pulse could have a duration of around 4 microseconds. The total capacitance of the stack could be in the region of 0.5 microfarads. Then the switchable capacitive element could have a value around 0.5 microfarads. Referring to FIG. 6 different voltage levels ($A_{low}$, $A_{high}$) on the cathode of −60 kV and −53 kV would correspond to a much bigger difference in cathode current levels ($B_{low}$, $B_{high}$), and similarly of RF power levels ($C_{low}$, $G_{high}$).

Of course, variations can be made without departing from the scope of the invention. Thus, two discrete capacitors could be used, one as C1, and the other in place of C2 to C9. Instead of switching a single capacitive element into or out of the switch stack, two or more capacitive elements can be switched in or out. Instead of a fixed tapping, the tapping could be selectable between different capacitive elements in the series connection. Further the switch arrangement S could connect to multiple tappings instead of to a single tapping. Each capacitive element could be a single capacitor, or could be made up of a number of capacitors, for example, four, in parallel. Instead of monitoring the cathode current in a current sensor associated with the magnetron, the current sensor could be arranged to sense current through the capacitive elements. Alternatively, the control loop could monitor RF pulse power or x ray energy. The switch stack S, or the switches S1 or S2, could be implemented by FETs or IGBTs, but the invention is also applicable to the switches S, S1, or S2 being a valve such as a tetrode or a triode. In order to reduce the voltage rating on the components of the switches S1, S2, an identical pair of IGBT transistors and diodes could be provided in series with that illustrated. This reduces the voltage rating on each of those components by a half. In other applications more devices may be connected in series to provide voltage rating or in parallel for current rating, or a series, parallel combination of devices may be used. While the magnetron is described as being part of a linac used for cargo screening, the invention may be used in non-destructive testing, radiotherapy, medical imaging, or the magnetron could be used to drive a particle accelerator. In addition, electron tubes other than magnetrons could be used, for example, klystrons, and the invention is also applicable to loads which are not vacuum tubes.

The physical arrangement of the capacitors may be a series parallel combination. For example, C1 to C9 may be made up from 144 capacitors. Each of nine capacitive elements connected in a chain may be made of two capacitors in parallel. Eight such series chain may be paralleled in the final assembly to achieve the required capacitance value, voltage rating, ESR, and physical size, required for the series connection C1 to C9.

Figure 7:
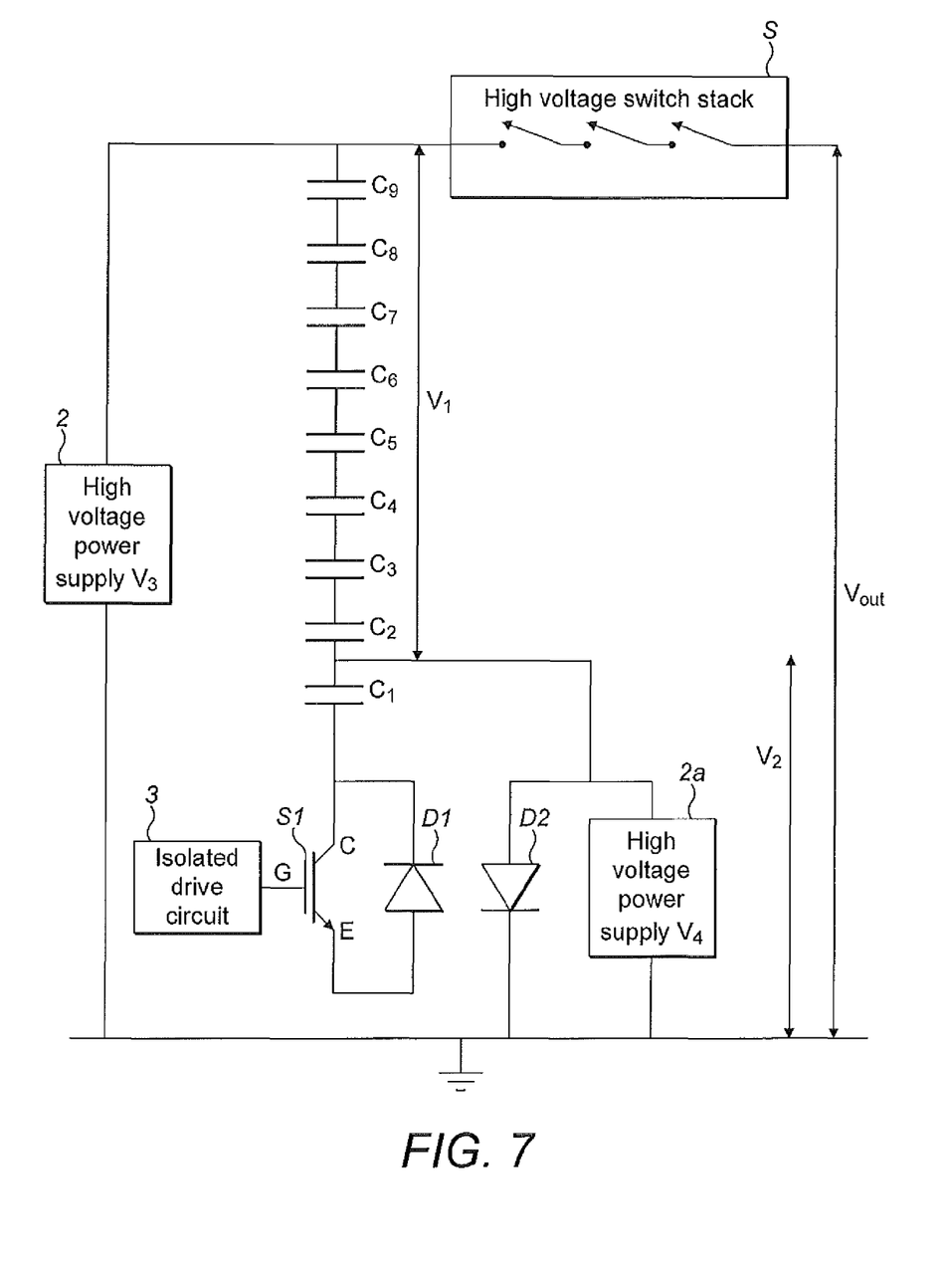
FIG. 7 is a schematic circuit diagram of parts of a second embodiment of the switching arrangement of FIG. 2.

In the embodiment described, the same power supply is used for charging the full stack and the stack without capacitive element C1. If desired, an auxiliary power supply may be provided for charging just the capacitive element C1. Referring to FIG. 7, in the second embodiment, a separate power supply 2a is provided to recharge C1 between high and low pulses. In this method, the difference between C2-C9 and C1-C9 can be varied by adding and subtracting charge from C1 in the inter pulse period. Power supply 2a is therefore required to be bidirectional delivering and receiving current from C1.

The invention enables different voltage levels to be produced without any significant loss of energy, and permits proprietary control systems, suitably programmed, to be used.

The invention claimed is:

1. A switching arrangement for applying voltage pulses across a load, comprising a plurality of capacitive elements connected in a series connection, a first switch arrangement for connecting one end of the series connection to one end of the load, a second switch arrangement for selectively connecting the other end of the series connection or a tapping between the ends of the series connection, to the other end of the load, in order to enable higher or lower voltage pulse levels to be applied across the load, and a control system to supply charging current through the series connection from one end, selectively to the other end or to the tapping, wherein the second switch arrangement comprises a pair of switches, with one switch of the pair being connected in a first path in series from the tapping to the other end of the series connection and a second switch of the pair being connected in a second path from the tapping in parallel with the first path, wherein the second switch arrangement is configured such that one of the switches in the pair of switches is controlled to be open and closed in opposition to the other of the switches in the pair of switches.

2. The switching arrangement as claimed in claim 1, in which the second switch arrangement includes respective diodes connected in anti-parallel with the switches of the second switch arrangement.

3. The switching arrangement as claimed in claim 1, in which the switches are solid state switches.

4. The switching arrangement as claimed in claim 3, in which the switches are FETs.

5. The switching arrangement as claimed in claim 3, in which the switches are insulated gate bipolar transistors.

6. The switching arrangement as claimed in claim 1, wherein the control system supplies charging current to an end of the series connection before a higher level pulse or to the tapping before a low level pulse.

7. The switching arrangement as claimed in claim 6, in which the control system is arranged to supplement the supply of charging current to the tapping with a supply to an end of the series connection before a low level pulse.

8. The switching arrangement as claimed in claim 6, in which the control system is arranged to supplement the supply of charging current to an end of the series connection with a supply to the tapping before a high level pulse.

9. The switching arrangement as claimed in claim 1, in which the second switch arrangement is arranged to operate during the delivery of a high voltage pulse so as to complete the pulse at low level.

10. The switching arrangement as claimed in claim 1, in which the voltage pulses are at least 10 kV in magnitude.

11. The switching arrangement as claimed in claim 10, in which the voltage pulses are at least 40 kV in magnitude.

12. The switching arrangement as claimed in claim 10, in which the difference in magnitude between the two levels of voltage pulses is at least 1 kV.

13. A modulator comprising a power supply in combination with the switching arrangement as claimed in claim 1.

14. A linear accelerator which includes a magnetron driven by the modulator as claimed in claim 13.

15. A modulator comprising:
a power supply; and
a switching arrangement for applying voltage pulses across a load, comprising a plurality of capacitive elements connected in series, a first switch arrangement for connecting one end of the series connection to one end of the load, a second switch arrangement for selectively connecting the other end of the series connection or a tapping between the ends of the series connection, to the other end of the load, in order to enable higher or lower voltage pulse levels to be applied across the load, and a control system to supply charging current through the series connection from one end, selectively to the other end or to the tapping, wherein the power supply is controllable to be set to a voltage and the modulator is arranged to split the voltage between the capacitive elements such that the higher voltage pulse level corresponds to the set voltage of the power supply.

16. The switching arrangement as claimed in claim 15, wherein the voltage pulses are at least 40 kV in magnitude.

17. The switching arrangement as claimed in claim 15, in which a difference in magnitude between the higher and lower voltage pulse levels is at least 1 kV.

18. The switching arrangement as claimed in claim 15, in which the second switch arrangement includes respective diodes connected in anti-parallel with the switches.

19. The switching arrangement as claimed in claim 15, wherein the control system supplies charging current to an end of the series connection before the higher level pulse or to the tapping before the lower level pulse.

20. The switching arrangement as claimed in claim 15, in which the second switch arrangement is arranged to operate during the delivery of the voltage pulse at the higher level so as to complete the voltage pulse at the lower level.

* * * * *